(12) United States Patent
Komatsubara

(10) Patent No.: US 6,673,660 B2
(45) Date of Patent: Jan. 6, 2004

(54) METHOD OF MANUFACTURING SEMICONDUCTOR ELEMENT

(75) Inventor: Hirotaka Komatsubara, Tokyo (JP)

(73) Assignee: Oki Electric Industry Co, Ltd., Tokyo (JP)

(*) Notice: Subject to any disclaimer, the term of this patent is extended or adjusted under 35 U.S.C. 154(b) by 0 days.

(21) Appl. No.: 10/059,124

(22) Filed: Jan. 31, 2002

(65) Prior Publication Data
US 2003/0068870 A1 Apr. 10, 2003

(30) Foreign Application Priority Data
Oct. 10, 2001 (JP) ........................ 2001-312069

(51) Int. Cl.7 .................... H01L 21/00; H01L 21/84
(52) U.S. Cl. .................. 438/156; 438/298; 438/423; 438/530
(58) Field of Search ................ 438/156, 157, 438/158, 159, 160, 161, 162, 163, 164, 165, 166, 307, 151, 298, 135, 155, 286, 306, 920, 530, 450, FOR 230, 423, FOR 158

(56) References Cited

U.S. PATENT DOCUMENTS

| 4,777,147 A | * 10/1988 | Scott et al. ............ 438/153 |
| 4,974,051 A | * 11/1990 | Matloubian et al. ..... 257/347 |
| 4,987,093 A | * 1/1991 | Teng et al. ............ 438/450 |
| 4,997,780 A | * 3/1991 | Szluk et al. ........... 438/153 |
| 5,326,710 A | * 7/1994 | Joyce et al. ........... 438/203 |
| 5,518,939 A | * 5/1996 | Negishi et al. ......... 438/158 |
| 5,686,347 A | * 11/1997 | Yang .................. 438/298 |
| 5,736,451 A | * 4/1998 | Gayet .................. 438/443 |
| 5,863,823 A | * 1/1999 | Burgener ............... 438/295 |
| 5,972,746 A | * 10/1999 | Wang et al. ........... 438/223 |
| 6,074,929 A | * 6/2000 | Thomas ................ 438/407 |
| 6,177,299 B1 | * 1/2001 | Hsu et al. ............ 438/149 |
| 6,277,684 B1 | * 8/2001 | Hayashi et al. ........ 438/225 |
| 6,333,234 B1 | * 12/2001 | Liu ................... 438/307 |
| 6,420,281 B2 | * 7/2002 | Okuno et al. .......... 438/787 |

FOREIGN PATENT DOCUMENTS

| JP | 03-155651 | * 3/1991 |
| JP | 10-012894 | * 1/1998 |
| JP | 2000-306994 | 11/2000 |

* cited by examiner

Primary Examiner—George Fourson
Assistant Examiner—Fernando Toledo
(74) Attorney, Agent, or Firm—Rabin & Berdo, P.C.

(57) ABSTRACT

According to the present invention, a semiconductor device to use a SOI substrate performing insulation by a LOCOS method in which an oxide resistivety film provided on a silicon layer is used, includes steps of: implanting impurity in a LOCOS edge which is a silicon layer under bird's beak of the field oxide film with the oxide resistant film as a mask after a field oxide film is formed and forming a high density impurity area having impurity density higher than impurity density of an impurity diffusion layer formed on the silicon layer, and removing a pad oxide film after a heat treatment is performed for the field oxide film after the high density impurity area is formed. Therefore, a method of manufacturing the semiconductor device at a lower cost to suppress occurrence of hump and to prevent a MOSFET characteristic from deteriorating can be provided.

24 Claims, 5 Drawing Sheets

METHOD OF MANUFACTURING SEMICONDUCTOR ELEMENT

BACKGROUND OF THE INVENTION

1. Field of the Invention

The present invention relates to a method of manufacturing a semiconductor. More particularly, the present invention relates to a method of manufacturing a semiconductor using a LOCOS (local oxidation of silicon) method as an insulation technique of a SOI (silicon on insulator) substrate by using the SOI as a semiconductor substrate.

2. Description of the Related Art

In recent years, the use of a SOI substrate constituted by an insulation layer and a silicon layer formed on the insulation layer has been proposed as a substrate to form a semiconductor element such as a MOSFET. The use of such SOI substrate has various advantages such as improvement in an S value relating to a sub threshold characteristic, reduction of parasitic capacitance, and removal of the latch-up phenomenon and the like.

There is a so-called STI (shallow trench isolation) method beside the LOCOS method as an insulation technique in a semiconductor device using the SOJ substrate. In insulation by the LOCOS method, an oxide resistant film such as, for example, a silicon nitride film is formed on the SOI substrate and a surface of the silicon layer exposed from the oxide resistant film is oxidized. As a result, a field oxide film serving as an insulation area is formed, and a part between semiconductor elements such as a MOSFET etc. formed in an active area with its field oxide film is insulated. On the other hand, in insulation by the STI method, a groove is previously formed by etching the silicon layer of the SOI substrate and an oxide film is buried in the groove. Electric insulation between the semiconductor elements is performed by the buried oxide film.

When insulating by the STI method, it is necessary to previously form the groove in which the oxide film is buried in the SOI substrate at a time when the insulation area is formed and it is further necessary to remove the oxide film outside of the groove after the oxide film is buried in the groove. A photolithography or an etching step of forming the groove, and a step of removing the oxide film are further necessary in insulation by the STI method in comparison with insulation by the LOCOS method. As a result, the number of steps is further increased in a method of manufacturing a semiconductor device using the STI method in comparison with the method of manufacturing a semiconductor device using the LOCOS method and thereby there is a problem in that the manufacturing cost is increased.

Therefore, insulation by the LOCOS method is capable of manufacturing the semiconductor device at a lower cost and is usually employed for semiconductor devices which use the conventional SOI substrate.

However, when the LOCOS method is used to manufacture a semiconductor device using an SOI substrate, a so-called bird's beak may be formed, where the oxide film extends from the field oxide film to the pad oxide film under the oxide resistant film at the time of forming the field oxide film to perform insulation. An area of extremely thin film is formed at an end of the field oxide film. This makes the area of extremely thin film to be formed on the silicon layer under the bird's beak part.

Accordingly, when an impurity diffusion layer such as source or drain is formed in an active area of the silicon layer insulated by the field oxide film, and then a gate oxide film or a gate electrode is formed and a semiconductor element such as the MOSFET is formed on the silicon layer, sufficient thickness of the field oxide film can not be maintained in an area defined by the silicon layer on which source or drain is formed and the gate electrode extending to an upper part of the silicon layer, particularly at an area of a thin film layer under the bird's beak part where the gate electrode extends to the upper part thereof. As a result, a part of a parasitism transistor to operate with a threshold lower than a threshold in a desired MOSFET is constituted.

When the parasitism transistor is formed on the silicon layer under the bird's beak part, that is, at a LOCOS edge, undesirable hump occurs in a sub threshold characteristic according to the conventional semiconductor device. It results in a problem that the desired transistor characteristic is not performed and the current characteristic of the MOSFET is deteriorated in the semiconductor device using the SOI substrate to which the conventional LOCOS method is applied.

SUMMARY OF THE INVENTION

Therefore, it is an object of the present invention to provide a method of manufacturing a semiconductor device employing an SOI substrate at a lower manufacturing cost using insulation by a LOCOS method, which is capable of suppressing occurrence of hump and preventing a MOSFET characteristic from deteriorating.

According to the present invention, a method of manufacturing a semiconductor element, including steps of: preparing a silicon layer formed via an insulation film on a substrate, forming an oxide resistant film selectively on a pad oxide film after the pad oxide film is formed on the silicon layer, forming a field oxide film by oxidizing the silicon layer under the pad oxide film exposed from the oxide resistant film, removing the oxide resistant film and the pad oxide film after forming the field oxide film, and forming a gate insulation film on the silicon layer, and forming a gate electrode on the gate insulation film and forming an impurity diffusion layer of a first conductive type on the silicon layer surface between the gate electrode and the field oxide film, is characterized by further including steps of: implanting impurity of a second conductive type in the silicon layer under the field oxide film with the oxide resistant film as a mask after the field oxide film is formed and forming an impurity area having an impurity density higher than the density of the impurity diffusion layer on the silicon layer under the field oxide film, and performing a heat treatment for the field oxide film after the impurity area is formed and then removing the pad oxide film.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on preferred embodiments, which do not intend to limit the scope of the present invention, but rather to exemplify the invention. All of the features and the combinations thereof described in the embodiments are not necessarily essential to the invention.

(First Embodiment)

Figure 1:
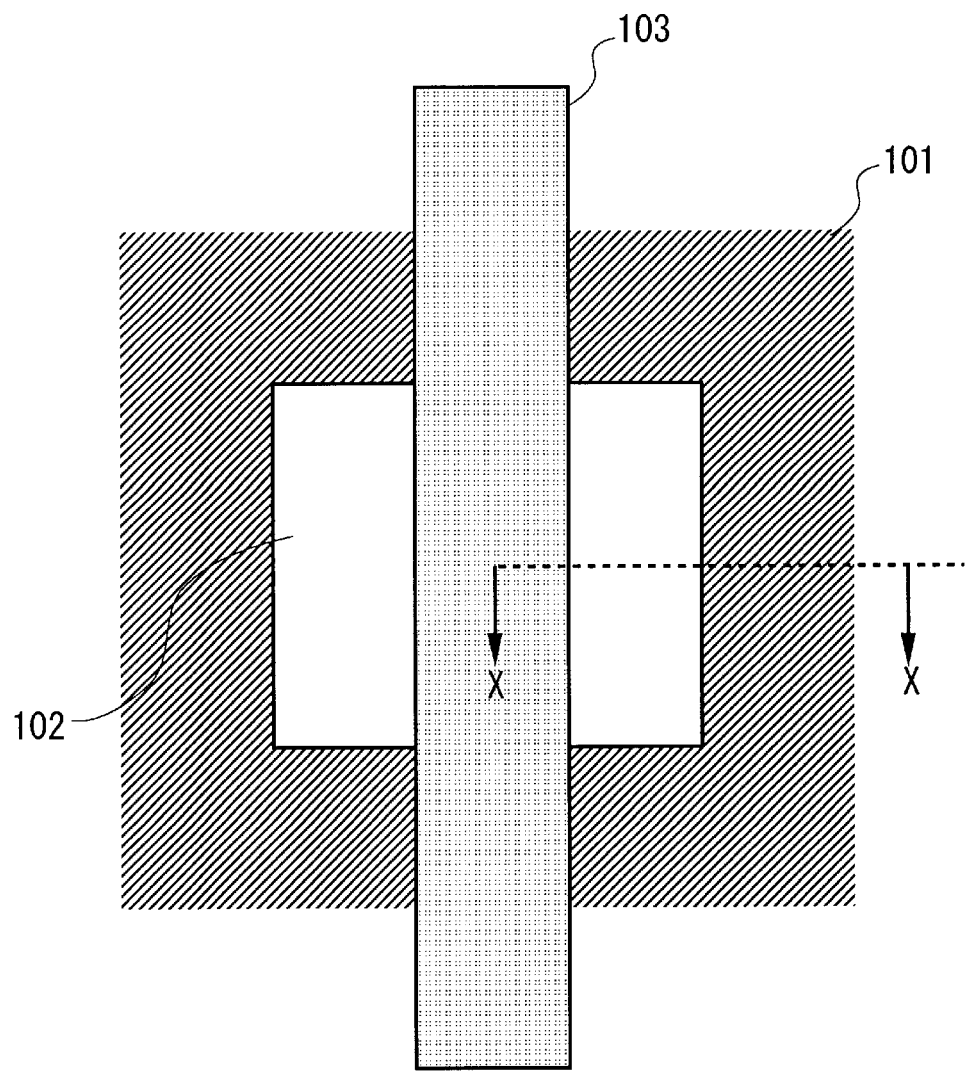
FIG. 1 is a plane view showing a semiconductor device of the present invention

Below, a first embodiment of the present invention will be described in detail with reference to accompanying drawings. FIG. 1 is a plane view of a semiconductor device according to the present invention. FIGS. 2A to 2F are sectional views of steps, viewed from X—X line of FIG. 1, respectively showing steps in a method of manufacturing a semiconductor device in the present embodiment.

As shown in FIG. 1, the semiconductor device of the present embodiment has a field oxide film 101 which electrically isolates elements from one another and an active area 102 defined by the field oxide film 101. An impurity diffusion layer such as source or drain is formed in the active area 102 formed in a substrate 100 and a gate electrode 103 is formed on the substrate 100 between source and drain. In this way, a MOSFET, which is a semiconductor element, is formed in the active area 102 of the substrate 100.

Next, a method of manufacturing the semiconductor device of the present embodiment will be described referring to FIGS. 2A to 2F.

In FIGS. 2A to 2F, a reference numeral 201 denotes a silicon substrate, a reference numeral 202 denotes a BOX oxide film, which is a buried insulation film, formed on the silicon substrate. A reference numeral 203 denotes a silicon layer formed on the BOX oxide film. An SOI substrate 204 consists of the silicon substrate 201, the BOX oxide film 202, and the silicon layer 203. Thickness of the oxide film 202 formed on the silicon substrate 201 is around 1000 Å to 1500 Å and thickness of the silicon layer 203 of a surface is around 400 Å to 500 Å.

The SOI substrate 204 may be formed by not only a SIMOX method but also a bonding method or the other method. The SIMOX method is to form the BOX oxide film 203 at a position which is at a predetermined depth from one main face of the silicon substrate 201 by implanting oxygen. The bonding method bonds the BOX oxide film 202 to the silicon layer 203.

Figure 2A:
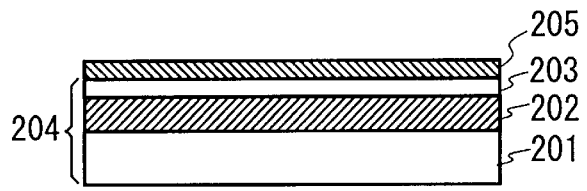
FIGS. 2A to 2F are sectional views respectively showing steps in a method of manufacturing a semiconductor device in a first embodiment.

After the SOI substrate 204 is prepared, the surface of the silicon layer 203 is oxidized by thermal oxidation as shown in FIG. 2A. A pad oxide film 205 with thickness of approximate 70 Å is formed on the silicon layer 203 by this thermal oxidation. This pad oxide film 205 has a function to improve adhesion of a silicon nitride film 206, as the oxide resistant film formed later, to the silicon layer 203.

The silicon nitride film with thickness of approximate 1000 Å is formed on the pad oxide film 205 by using a CVD method. Patterning for the silicon nitride film is performed by the photolithography and etching known in a conventional technique. The oxide resistant film 206 which defines the active area 102 is formed in a predetermined shape by this patterning.

Figure 2B:
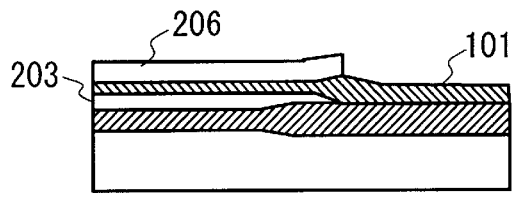
Figure 2C:
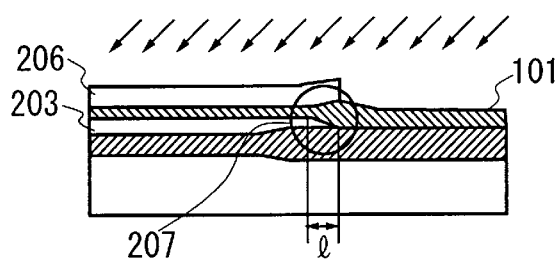

As shown in FIG. 2B, a thermal oxidation process is performed for the silicon layer 203 exposed from the oxide resistant film 206 with the oxide resistant film 206 as a mask. The thermal oxidation process like a dry oxide at 1000° C. is performed for about 60 minutes. The field oxide film 101 with thickness of approximate 1200 Å is formed on a face on which the silicon layer 203 is exposed from the silicon nitride film to function as the oxide resistant film 206. The field oxide film 101 functions as an insulation area to electrically insulate the elements. Bird's beak 207 with length of approximate 500 Å, which extends from the field oxide film 101 to a pad oxide film under an oxide resistant film 206 is formed from an end of the silicon layer 203 at an end part of the field oxide film 101 by this thermal oxidation process. Length of bird's beak is suitably determined by a condition (temperature or atmosphere etc.) to form thickness of the oxide resistant film 206 or the field oxide film 101.

In a manufacturing method of the present embodiment, in order to suppress a hump of the sub threshold characteristic, a P typed impurity such as boron (B) or boron fluoride (BF2) is implanted in the silicon layer 203 after the field oxide film 101 is formed, if a MOSFET having an N typed impurity diffusion layer (hereinafter, referred to as NMOS) is to be manufactured, with the oxide resistant film 206 serving as a mask. In contrast, an N typed impurity such as phosphorous (P) or arsenic (As) is implanted in the silicon layer 203 if a MOSFET having a P typed impurity diffusion layer (hereinafter, referred to as PMOS) is to be manufactured. Thereby, a high density impurity area 208 is formed in the silicon layer at bird's beak 207, i.e., at a LOCOS edge (See FIG. 2C). At this time, it is preferable that an implantation angle of about 45° be used, that the dose amount is $8 \times 10^{13}$ ions/cm2, and that the acceleration energy is around 20 keV to 60 keV, as ion implanting conditions in the case where the high density impurity area is formed in an NMOS. It is preferable that the implantation angle is at about 45°, the dose amount is $1 \times 10^{13}$ ions/cm$^2$, and the acceleration energy is around 35 keV in the case where the high density impurity area is formed in a PMOS. This ion implantation step allows the impurity density at the LOCOS edge to be increased. Specially, it is possible to keep the impurity density at the LOCOS edge under the gate electrode 103 formed in a step later at a high level. Thereby, the threshold of the parasitism or parasitic transistor can be increased and the occurrence of a hump can be suppressed.

In the manufacturing method of the present embodiment, after the ion implantation step is carried out, anneal or heat treatment is performed for the SOI substrate 204 prior to removal of the pad oxide film 205. It is preferable that heat treatment is performed, at temperature and time so that impurity of the previously formed high density impurity area 208 is not diffused to a MOSFET channel area 201, in particularly, temperature is about 1000° C. under passivation gas atmosphere and time is about 10 seconds to 10 minutes. It is preferable to perform heat treatment approximately at 700° C. to 800° C. for 30 minutes in a case where heat treatment is necessary with superior control.

In the manufacturing method of the present embodiment, it becomes possible to recovery damage of the field oxide film 101 such as crystal defect or out-of-lattice, which occurs by implanting ion in forming the high density impurity area 208 without increase of a resistance in the channel area which makes the MOSFET characteristic degrade by this heat treatment. By passing through such a damage recovery step of the field oxide film 101, amount for etching the field oxide film at approximate 30% to 50% can be reduced in comparison with amount for etching the field oxide film 101 in the case where heat treatment is not performed at the time of, later, removal of the pad oxide film 206 made by dipping a film in hydrofluoric acid (HF) of 0.3%. According to the manufacturing method of the present embodiment, reduction of the field film due to removal of the pad oxide film 205 lowers and sufficient thick thickness of the field oxide film 101 can be obtained. The field oxide film 101 is between the silicon layer 203 and the gate electrode 103 to extend to an upper part. Occurrence of the parasitism transistor can further be suppressed in comparison with the case where the high density impurity area is formed at the LOCOS edge.

Figure 3:
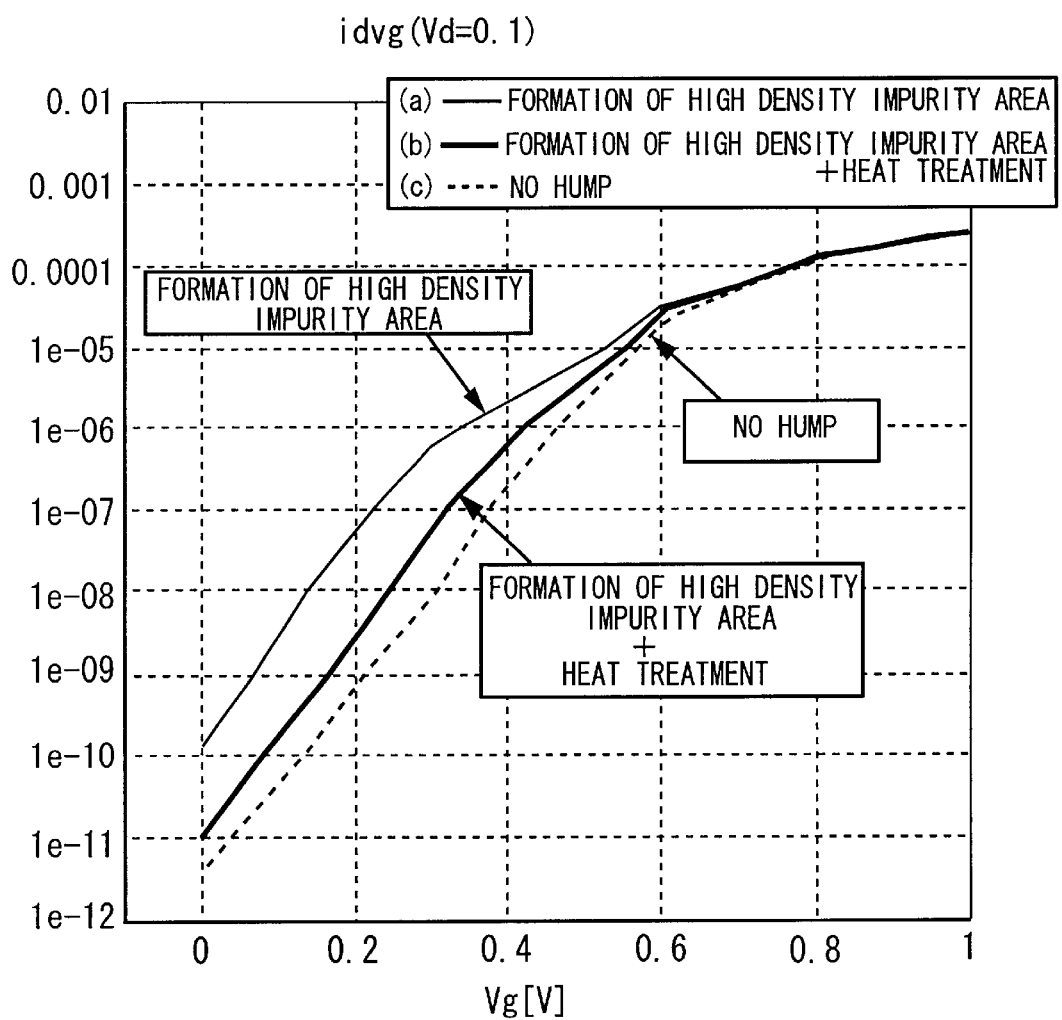
FIG. 3 is a graph showing relation of a drain current to a gate voltage of a MOSFET.

Effect of the present invention will be described referring to FIG. 3. FIG. 3 is a graph showing relation of a drain current to a gate voltage of the MOSFET. In FIG. 3, abscissas and ordinates respectively show a drain current (Id) and a gate voltage (Vg).

Gate length of the MOSFET is approximate 0.15 μm and the drain voltage in FIG. 3 is approximate 0.1V.

It is seen from FIG. 3 that in a case where the gate voltage of approximate 0.3V is applied, occurrence of the parasitism transistor can not be sufficiently suppressed in the MOSFET in which the high density impurity area is formed at the LOCOS like a graph (a) and heat treatment is not performed and, as a result, hump occurs. On the other hand, in a case where the gate voltage of approximate 0.3V is applied, by employing the manufacturing method of the present embodiment, the drain current of the MOSFET, in which the high density impurity area is formed and heat treatment is performed prior to removal of the pad oxide film, like a graph (b), can be suppressed to approximate one-tenth in comparison with increase of the MOSFET in the case in which only the high density impurity area is formed like the graph (a).

The MOSFET with sufficient thickness of the field oxide film 101 can be formed and retained in a state to form the high density impurity area 208 at the LOCOS edge by adding heat treatment to perform damage recovery of the field oxide film 101 after ion is implanted according to the present embodiment. The field oxide film 101 is between the silicon layer 203 and the gate electrode 103 to extend to the upper part. According to the present embodiment, the semiconductor device to further suppress the parasitism transistor can be manufactured in comparison with a semiconductor device only having the high density impurity area 208 at the LOCOS edge.

Figure 2D:
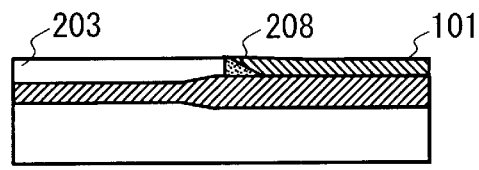
Figure 2E:
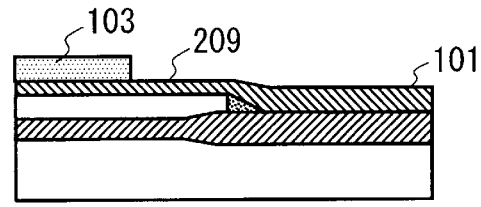
Figure 2F:
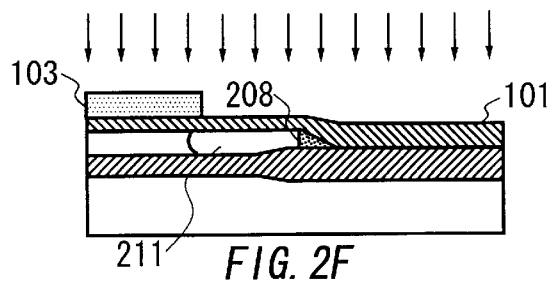

After a heat treatment step is performed, the pad oxide film 205 on the field oxide film 101, the oxide resistant film 206, and the pad oxide film 205 on the silicon layer 203 are removed as shown in FIG. 2D. The oxide resistant film 206, which consists of the silicon nitride film is removed by an etching process using, for example, thermal phosphoric acid. The pad oxide film 205 formed on the silicon layer 203 is removed by the etching process using, for example, the hydrofluoric acid (HF) of 0.3%. Thereby, the silicon layer 203 under the pad oxide film 205 is exposed.

After that, an oxide netridation film (SiON), which is the gate insulation film 209, with thickness of approximately 30 Å is formed on the silicon layer 203 of the exposed active area 101 and impurity ion for adjusting threshold to heighten the MOSFET threshold is implanted in the active area 101 via the gate insulation film 209. Then, a polysilicon film is formed on the gate insulation film 209 and the gate electrode 103 to function as a gate of a transistor is formed by the conventional photolithography and etching. Lastly, ion of impurity with the gate electrode 103 and the field oxide film 101 as the mask is implanted and an impurity diffusion layer 211 to function as a source area or a drain area of the MOSFET is formed on the silicon layer 203 of the active area 102.

After these steps are passed through, the semiconductor element of the MOSFET is formed on the silicon layer 203 of the active area 101 which constitutes the semiconductor device.

In the manufacturing method of the semiconductor device of the present embodiment, after the high density impurity area 208 is formed at the LOCOS edge, an etching rate for the HF of the field oxide film 101 formed by the silicon oxide film, which is the same as the pad oxide film 205 removed by the hydrofluoric acid (HF), is slow by adding heat treatment to recovery damage of the field oxide film 101 such as crystal defects or out-of-lattice defects, which occur by implanting ions in forming the high density impurity area 208 prior to removal of the pad oxide film 205. In the semiconductor device, to suppress the occurrence of a hump by forming the high density impurity area 208 at the LOCOS edge, an amount for etching the field oxide film 101 at the time of removal of the pad oxide film 205 is sufficiently reduced and a sufficient thickness of the field oxide film is obtained. The field oxide film 101 is between the silicon layer 203 on which the source or the drain area of the MOSFET is formed and the gate electrode 103 to extend to the upper part.

It becomes possible to form the MOSFET showing the intrinsically desired transistor characteristic in which the transistor is not formed by lowering impurity density in a channel area and suppressing thinness of the field oxide film, which is cause of parasitism transistor occurrence according to the manufacturing method of the present embodiment.

According to the method of manufacturing the semiconductor device in the present embodiment, occurrence of the parasitism transistor is not used and the semiconductor element of the MOSFET etc. can be formed on the SOI substrate in the semiconductor device of the SOI substrate by using the LOCOS method. Thereby, it becomes possible to provide the semiconductor device using the SOI substrate at a low manufacturing cost.

In the method of manufacturing the semiconductor device of the first embodiment, heat treatment to remove damage of the field oxide film may be performed under atomosphere including oxygen ($O_2$) in the heat treatment step for the field oxide film. When heat treatment is performed under such atomosphere, oxidation at the LOCOS edge is promoted and a distance 1 of bird's beak part 207 of the field oxide film can be short. It becomes possible to suppress occurrence of hump.

In addition, in the method of manufacturing the semiconductor device of the first embodiment, oxygen ion is implanted to the LOCOS edge with oxide resistant film 206 as the mask and the heat treatment step for implanted oxygen ion may be added after ion to form the high density impurity area 208 to suppress hump at the LOCOS edge is implanted.

By adding the step, oxygen ion implanted to the LOCOS edge and a silicon included in the silicon layer 203 are reacted, and a new silicon oxide film is formed at the LOCOS edge. The distance 1 of bird's beak 207 in the field oxide film can be short by this new oxide film and occurrence of hump can be suppressed.

It is preferable that implantation by oxygen ion is performed under a condition where oxygen ion is implanted to the LOCOS edge as much as possible, in particularly, the implantation angle is at about 45°, acceleration energy is around 30 keV to 50 keV, dose amount is equal to or over $5.0 \times 10^{17}$ ions/cm$^2$.)

It is preferable that heat treatment for oxygen ion implanted to the LOCOS edge is performed at 1000° C. or more high temperature in the atmospheric pressure and $O_2$ or $N_2$ atmosphere. Heat treatment can double as heat treatment to recovery damage of the field oxide film 101.

In the method of manufacturing the semiconductor device in the first embodiment, an implantation step of ion which makes the LOCOS edge such as silicon (Si) or argon (Ar) amorphous, with the oxide resistant film 206 as the mask may be added after ion to form the high density impurity area 208 to suppress hump formed at the LOCOS edge is implanted.

Generally, it is possible to suppress diffusion of impurity included in the high density impurity area 208 formed at the LOCOS edge in the amorphous silicon layer 203.

Since the impurity density of the high density impurity area 208 can be kept at the high level by adding these steps to the manufacturing method of the first embodiment, occurrence of hump can further be suppressed.

(Second Embodiment)

Next, a method of manufacturing a semiconductor device in a second embodiment will be described.

FIGS. 4A to 4E are views showing a method of manufacturing a semiconductor device in a second embodiment. FIGS. 4A to 4E are sectional views of respective steps viewed from X—X line of FIG. 1. The same numerals as numerals shown in the first embodiment show the same or similar part.

In the method of manufacturing the semiconductor device in the second embodiment, features different from ones in the first embodiment are to previously form the silicon nitride film of a protection film 401 to cover bird's beak 207 of the field oxide film before the pad oxide film on the field oxide film 101, the oxide resistant film 206 and the pad oxide film on the silicon layer 203 are sequentially removed.

Figure 4A:
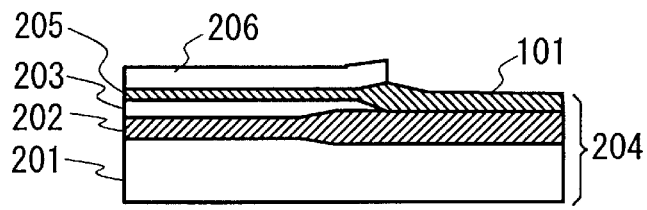
FIGS. 4A to 4E are sectional views respectively showing steps in a method of manufacturing a semiconductor device in a second embodiment.

Similar to the method of manufacturing the semiconductor device in the first embodiment, the SOI substrate 204 and the pad oxide film are formed, and then the oxide resistvity film 206 is formed in a predetermined shape to determine the active area 102 as shown in FIG. 4A. Next, heat treatment for the silicon layer 203 exposed from the oxide resistant film 206 is performed with the oxide resistively film 206 as the mask and the field oxide film 101 to insulate elements is formed in a predetermined area of the silicon layer 203.

Figure 4B:
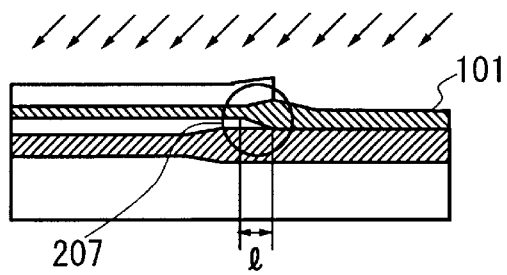
Figure 4C:
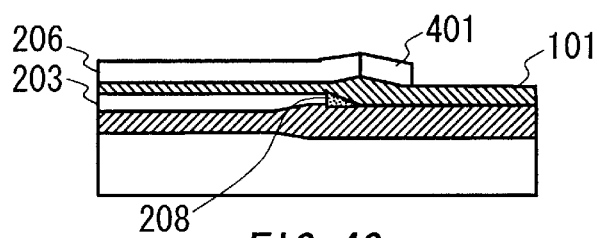

Ion of impurity is implanted with the oxide resistant film 206 as the mask as shown in FIG. 4B and the high density impurity area 208 to suppress hump is formed on the silicon layer 203 (LOCOS edge) under bird's beak 207.

After the high density impurity area 208 is formed, the protection film 401 to cover one part of the field oxide film 101 is formed by the silicon nitride film etc. It is preferable that the protection film 401 surely covers bird's beak 207 on which the silicon layer 203 with extreme thin film is formed. For example, when a film of the silicon layer 203 is 400 Å to 500 Å, thickness of the oxide resistant film 206 is 1000 Å, and a condition to form the field oxide film 101 meet dry oxide, 1000° C., 60 minutes, the distance 1 of bird's beak 207 formed in a step of forming the field oxide film is around 500 Å. Thereby, it is preferable that an end of the protection film 401 is placed at a position of 500 Å or more distance apart away from an end of bird's beak 207.

Figure 4D:
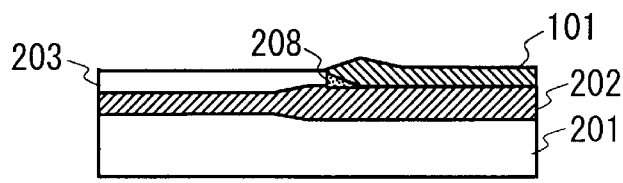

As shown in FIG. 4D, after the protection film 401 to cover bird's beak 207 is formed, the pad oxide film on the field oxide film 101 is removed, the oxide resistant film 206, and the pad oxide film on the silicon layer 203 are sequentially removed. In the present embodiment, when the pad oxide film on the field oxide film 101 is removed, a native oxide film formed on the oxide resistant film 206 is removed. Similar to the first embodiment, the pad oxide film 205 is removed by a HF process and the oxide resistant film 206 is removed by the thermal phosphoric acid process in the second embodiment.

In the manufacturing method of the second embodiment, before the pad oxide film 205 is removed, heat treatment to recovery damage of the field oxide film 101 described in the aforementioned first embodiment is performed for the SOI substrate 204.

By this heat treatment, it becomes possible to suppress amount for etching the field oxide film 101 with removing the pad oxide film 205. Sufficient thick thickness of the field oxide film 101 can be obtained. The field oxide film 101 is between the silicon layer 203 and the gate electrode 103 to extend to an upper part. Occurrence of the parasitism transistor can further be suppressed in comparison with the first embodiment.

Figure 4E:
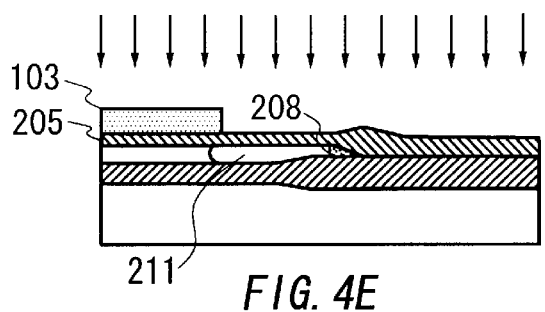

As shown in FIG. 4E, the gate insulation film 209 and the gate electrode 103 are formed on the exposed silicon layer 203 and the impurity diffusion layer 211 which becomes a source area and a drain area of a MOSFET is formed in an active area 102 by ion implantation with the gate electrode 103 and the field oxide film 101 as a mask. Thereby, a desired MOSFET is formed.

In the method of manufacturing the semiconductor device of the second embodiment, the field oxide film of bird's beak 207 is surely protected with the protection film 401. Etching of the film in the field oxide film of bird's beak 207 is not made by an HF process. A native oxide film formed on the oxide resistant film 206 is removed after the protection film 401 is formed, that is, the HF process in which the pad oxide film on the field oxide film 101 is removed. According to the manufacturing method of the present embodiment, sufficient thick thickness of the field oxide film in bird's beak 207, which greatly contributes on occurrence of the parasitism transistor can be obtained and occurrence of the parasitism transistor can further be suppressed in comparison with the first embodiment.

(Third Embodiment)

Next, a method of manufacturing a semiconductor device in a third embodiment will be described.

FIGS. 5A to 5D are views showing the method of manufacturing the semiconductor device in the third embodiment and FIGS. 5A to 5E are sectional views of respective steps viewed from X—X line of FIG. 1. The same numerals as numerals shown in the first embodiment show the same or similar part.

In the method of manufacturing the semiconductor device in the third embodiment, features different from ones in the first the second embodiments are to use a mask 501 to cover bird's beak 207 of a field oxide film and makes an active area 102 of a silicon layer 203 surface to be exposed at a time of ion implantation to form an impurity diffusion layer 511 which is a source area or a drain area of a MOSFET. In the manufacturing method of the third embodiment, the impurity diffusion layer which becomes the source area and drain area of a parasitism transistor is not formed at a LOCOS edge by using this mask.

Figure 5A:
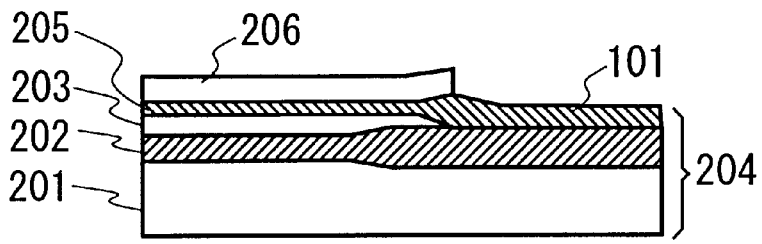
FIGS. 5A to 5D are sectional views respectively showing steps in a method of manufacturing a semiconductor device in a third embodiment.

Similar to the methods of manufacturing the semiconductor devices in the first and the second embodiments, a SOI substrate 204 and a pad oxide film are formed, and then an oxide resistvity film 206 is formed in a predetermined shape to define an active area 102 as shown in FIG. 5A. Next, heat treatment for the silicon layer 203 exposed from an oxide resistant film 206 is performed with the oxide resistively film 206 as a mask and a field oxide film 101 to insulate elements is formed in a predetermined area of the silicon layer 203.

Figure 5B:
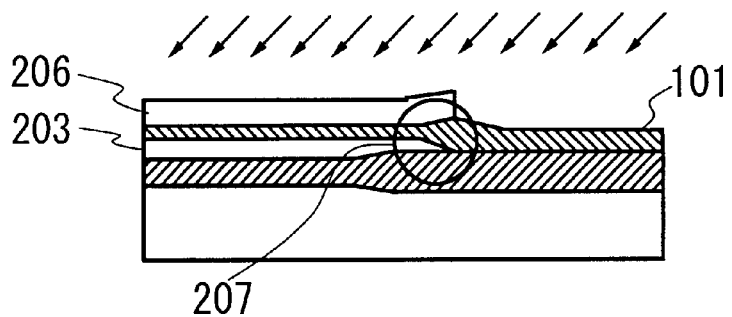

Ion of impurity is implanted with the oxide resistant film 206 as the mask as shown in FIG. 5B and high density impurity area 208 to suppress hump is formed on the silicon layer 203 (LOCOS edge) under bird's beak 207.

Figure 5C:
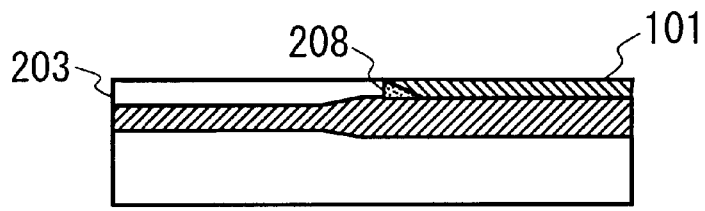

After the high density impurity area 208 is formed, the pad oxide film on the field oxide film 101, the oxide resistant film 206, and the pad oxide film on the silicon layer 203 are sequentially removed as shown in FIG. 5C. Similar to the first embodiment, a pad oxide film 205 is removed by an HF process and the oxide resistant film 206 is removed by the thermal phosphoric acid process.

In the manufacturing method, heat treatment to recovery damage of the field oxide film 101 is performed for the SOI substrate 204 before the pad oxide film 205 is removed.

Figure 5D:
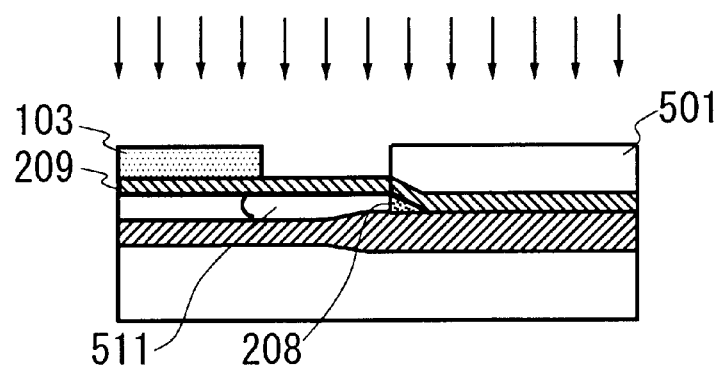

As shown in FIG. 5D, a gate insulation film 209, a gate electrode 103, and the mask 501 for impurity diffusion layer formation are formed on an exposed silicon layer 203.

It is preferably that the mask 501 for the impurity diffusion layer formation is formed by a resist used generally and film thickness is around 500 Å to 1000 Å. It is preferable that a position to set the mask 501 on the SOI substrate 204 is a position where one end of the mask 501 covers a tip of bird's beak 207 in the field oxide film.

After the mask 501 for impurity diffusion layer formation is formed, ion with the gate electrode 103 and the mask 501 as the mask is implanted similar to the first and the second embodiments. Thereby, an impurity diffusion layer 511 which becomes the source area or the drain area of the MOSFET is formed in the active area 102 of the silicon layer 203. After these steps are passed through, the desired MOSFET is formed.

In the method of manufacturing the semiconductor device of the present embodiment, the mask 501 for impurity diffusion layer formation is previously formed on a position where the tip of bird's beak 207 is covered and the impurity diffusion layer 511 which becomes the source area or the drain area of the MOSFET with the mask 501 and the gate electrode 103 as the mask is formed.

According to the manufacturing method of the present embodiment, the MOSFET not having the impurity diffusion layer such as the source area or the drain area can be formed at the LOCOS edge. Since the impurity diffusion layer to function as the source or the drain of the MOSFET is not formed at the LOCOS edge even if damage of the field oxide film 101 can not be sufficiently recovered in a heat treatment step prior to removal of the pad oxide film 205 and the field oxide film is slightly etched at the time of removal of the pad oxide film 205, the parasitism transistor is not formed. According to the present embodiment, it becomes possible to provide a semiconductor device to further suppress occurrence of the parasitism transistor.

As described the above, according to the present invention in which after a high density impurity area 208 is formed at a LOCOS edge, heat treatment is added to recovery damage of a field oxide film 101 such as crystal defect or out-of-lattice, which occurs by implanting ion in forming a high density impurity area 208 prior to removal of a pad oxide film 205, it becomes possible to provide a method of manufacturing a semiconductor device using a SOI substrate performing insulation by a LOCOS method at a low cost, in which occurrence of hump is suppressed and deterioration of the MOSFET characteristic can be prevented.

Although the present invention has been described by way of exemplary embodiments, it should be understood that those skilled in the art might make many changes and substitutions without departing from the spirit and the scope of the present invention which is defined only by the appended claims.

What is claimed is:

1. A method of manufacturing a semiconductor element comprising:

preparing a substrate having a silicon layer formed on an insulation film, forming a pad oxide film on the silicon layer, forming an oxide resistant film selectively on the pad oxide film so as to cover a portion of the pad oxide film and leave another portion exposed, the oxide resistant film having a peripheral region, forming a field oxide film by oxidizing the silicon layer under the portion of the pad oxide film exposed by the oxide resistant film, the formation of the field oxide film leaving a bird's beak region in the silicon layer beneath the peripheral region of the oxide resistant film, introducing an impurity of a first conductive type in the bird's beak region of the silicon layer to form an impurity area, performing a heat treatment for the field oxide film after the impurity area is formed, removing the oxide resistant film and the pad oxide film from the heat treated substrate, forming a gate insulation film on the silicon layer, forming a gate electrode on the gate insulation film, and forming an impurity diffusion layer of a second conductive type in the silicon layer between the gate electrode and the field oxide film, wherein the impurity diffusion layer has an impurity density that has an impurity density that is lower than that of the impurity area.

2. A method of manufacturing a semiconductor element as claimed in claim 1, wherein the field oxide film contacts the insulation film.

3. A method of manufacturing a semiconductor element as claimed in claim 1, wherein the heat treatment mends damage of the field oxide film.

4. A method of manufacturing a semiconductor element as claimed in claim 3, wherein the heat treatment is performed for less than about 10 minutes at about 1000° C. or more.

5. A method of manufacturing a semiconductor element as claimed in claim 4, further comprising implanting oxide ions in the silicon layer under the field oxide film prior to the heat treatment.

6. A method of manufacturing a semiconductor element as claimed in claim 3, wherein the heat treatment is performed for less than about 30 minutes at about 800° C. or less.

7. A method of manufacturing a semiconductor element as claimed in claim 3, wherein the heat treatment is performed in an atmosphere that includes oxygen.

8. A method of manufacturing a semiconductor element as claimed in claim 1, wherein the step of introducing an impurity, to form the impurity area, is conducted using an implantation angle of about 45°.

9. A method of manufacturing a semiconductor element comprising:

preparing a substrate having a silicon layer formed on an insulation film, forming a pad oxide film on the silicon layer, forming an oxide resistant film selectively on the pad oxide film so as to cover a portion of the pad oxide film and leave another portion exposed, the oxide resistant film having a peripheral region, forming a field oxide film by oxidizing the silicon layer under the portion of the pad oxide film exposed by the oxide resistant film, the formation of the field oxide film leaving a bird's beak region in the silicon layer beneath the peripheral region of the oxide resistant film, introducing an impurity of a first conductive type in the bird's beak region of the silicon layer under the field oxide film to form an impurity area, performing a heat treatment for the field oxide film after the impurity area is formed, removing the oxide resistant film and the pad oxide film from the heat treated substrate, forming a gate insulation film on the silicon layer, forming a gate electrode on the gate insulation film, forming a mask covering the field oxide film, and forming an impurity diffusion layer of a second conductive type in the silicon layer between the gate electrode and the field oxide film, wherein the impurity diffusion layer has an impurity density that is lower than that of the impurity area.

10. A method of manufacturing a semiconductor element as claimed in claim 9, wherein the field oxide film contacts the insulation film.

11. A method of manufacturing a semiconductor element as claimed in claim 9, wherein the heat treatment mends damage of the field oxide film.

12. A method of manufacturing a semiconductor element as claimed in claim 11, wherein the heat treatment is performed for less than about 10 minutes at about 1000° C. or more.

13. A method of manufacturing a semiconductor element as claimed in claim 12, further comprising implanting oxide ions in the silicon layer under the field oxide film prior to the heat treatment.

14. A method of manufacturing a semiconductor element as claimed in claim 11, wherein the heat treatment is performed for less than about 30 minutes at about 800° C. or less.

15. A method of manufacturing a semiconductor element as claimed in claim 9, wherein the heat treatment is performed in an atmosphere that includes oxygen.

16. A method of manufacturing a semiconductor element as claimed in claim 9, wherein the step of introducing an impurity, to form the impurity area, is conducted using an implantation angle of about 45°.

17. A method of manufacturing a semiconductor element comprising:

preparing a substrate having a silicon layer formed on an insulation film, forming a pad oxide film on the silicon layer, forming an oxide resistant film selectively on the pad oxide film so as to cover a portion of the pad oxide film and leave another portion exposed, the oxide resistant film having a peripheral region, forming a field oxide film by oxidizing the silicon layer under the portion of the pad oxide film exposed by the oxide resistant film, the formation of the field oxide film leaving a bird's beak region in the silicon layer beneath the peripheral region of the oxide resistant film, introducing an impurity of a first conductive type in the bird's beak region of the silicon layer under the field oxide film to form an impurity area, forming a protection film to cover the area of the silicon layer under the field oxide film, performing a heat treatment for the field oxide film after the impurity area is formed, removing the oxide resistant film and the pad oxide film from the heat treated substrate, forming a gate insulation film on the silicon layer, forming a gate electrode on the gate insulation film, and forming an impurity diffusion layer of a second conductive type in the silicon layer between the gate electrode and the field oxide film, wherein the impurity diffusion layer has a density that is lower than that of the impurity area.

18. A method of manufacturing a semiconductor element as claimed in claim 17, wherein the field oxide film contacts the insulation film.

19. A method of manufacturing a semiconductor element as claimed in claim 17, wherein the heat treatment mends damage of the field oxide film.

20. A method of manufacturing a semiconductor element as claimed in claim 19, wherein the heat treatment is performed for less than about 10 minutes at about 1000° C. or more.

21. A method of manufacturing a semiconductor element as claimed in claim 20, further comprising implanting oxide ions in the silicon layer under the field oxide film prior to the heat treatment.

22. A method of manufacturing a semiconductor element as claimed in claim 19, wherein the heat treatment is performed for less than about 30 minutes at about 800° C. or less.

23. A method of manufacturing a semiconductor element as claimed in claim 17, wherein the heat treatment is performed in an atmosphere that includes oxygen.

24. A method of manufacturing a semiconductor element as claimed in claim 17, wherein the step of introducing an impurity, to form the impurity area, is conducted using an implantation angle of about 45°.

* * * * *